(12) United States Patent
Okumura

(10) Patent No.: US 8,743,534 B2
(45) Date of Patent: Jun. 3, 2014

(54) RESIN CHASSIS BASE, AND ELECTRIC APPARATUS AND DISPLAY APPARATUS PROVIDED WITH THE SAME

(75) Inventor: Tsuyoshi Okumura, Higashiosaka (JP)

(73) Assignee: Sanyo Electric Co., Ltd., Moriguchi-shi (JP)

( * ) Notice: Subject to any disclaimer, the term of this patent is extended or adjusted under 35 U.S.C. 154(b) by 150 days.

(21) Appl. No.: 13/369,465

(22) Filed: Feb. 9, 2012

(65) Prior Publication Data
US 2012/0218694 A1    Aug. 30, 2012

(30) Foreign Application Priority Data

Feb. 28, 2011    (JP) .................................. 2011-041770

(51) Int. Cl.
*G06F 1/16*    (2006.01)
(52) U.S. Cl.
USPC ........... 361/679.06; 439/460; 313/46; 349/68
(58) Field of Classification Search
USPC ......... 439/607, 133, 331, 350, 460, 391, 131, 439/626, 188; 313/46; 361/679.56, 679.32, 361/679.09, 679.01, 679.31, 679.6, 679.17, 361/679.48, 679.33, 679.23, 679.03, 361/679.15, 679.21, 679.27; 349/62, 38, 349/139, 58
See application file for complete search history.

(56) References Cited

U.S. PATENT DOCUMENTS

| | | | |
|---|---|---|---|
| 2007/0024167 A1* | 2/2007 | Kim | 313/46 |
| 2007/0076396 A1* | 4/2007 | Kim | 361/796 |
| 2007/0134984 A1* | 6/2007 | Baik et al. | 439/607 |

FOREIGN PATENT DOCUMENTS

JP    05-018018 U    3/1993

\* cited by examiner

*Primary Examiner* — Hung Duong
(74) *Attorney, Agent, or Firm* — Westerman, Hattori, Daniels & Adrian, LLP

(57) ABSTRACT

The present invention provides a resin chassis base that can correspond to for various components and components with various sizes by providing a plurality of sets of mounting holes thereon. The present invention provides a resin chassis base that fixes an electric substrate, and is mounted to a component provided in an electric apparatus, the resin chassis base having formed thereon the plurality of sets of mounting holes in order to be screwed to various components and/or components with various sizes. The resin chassis base is screwed by use of any one of the plurality of sets of the mounting holes formed on the resin chassis base.

4 Claims, 4 Drawing Sheets

US 8,743,534 B2

RESIN CHASSIS BASE, AND ELECTRIC APPARATUS AND DISPLAY APPARATUS PROVIDED WITH THE SAME

BACKGROUND OF THE INVENTION

1. Field of the Invention

The present invention relates to a resin chassis base that fixes an electric substrate and is provided to an electric apparatus, e.g., a display apparatus such as a thin liquid crystal display apparatus, and more particularly to a resin chassis base that can be mounted to various display panels of different types, each having a different inch size, and specification, and to an electric apparatus and a display apparatus provided with the resin chassis base.

2. Description of Related Art

A resin chassis base having mounted thereon various electric substrates and the like, is provided in an electric apparatus. The resin chassis base is bonded by being screwed to an internal member of the electric apparatus or a cabinet serving as a casing.

For example, Japanese Unexamined Utility Model Publication No. 5-18018 describes that a locking portion is integrally formed on a predetermined position of a resin chassis base, to which a capacitor or the like is mounted, so as to project, and the locking portion is fitted to a mounting hole formed on an internal member, in order to mount the resin chassis base.

SUMMARY OF THE INVENTION

The position of the mounting hole for the resin chassis base might be varied, if the type, specification or size such as inch size of the member to which the resin chassis base is mounted is different, depending upon electric apparatuses, or even in the same electric apparatus. Therefore, a plurality of types of resin chassis bases according to the position of the mounting hole have to be prepared.

However, in order to form the plurality of types of resin chassis bases, a plurality of types of molds have to be required, which makes parts management in a production factory complicated, and might increase cost.

As for a display apparatus, it is considered that a resin chassis base is directly mounted to a cavity serving as a housing. However, the resin chassis base has to be formed so as to cross a display panel mounted therein. Therefore, this might increase a size of the resin chassis base, leading to an increase in component cost and increase in weight of components.

The present invention aims to provide a resin chassis base that can correspond to various components and components with various sizes by providing a plurality of sets of mounting holes thereon.

In order to solve the foregoing problems, a resin chassis base according to the present invention fixes an electric substrate, and is mounted to a component provided in an electric apparatus, the resin chassis base having formed thereon the plurality of sets of mounting holes in order to be screwed to various components and/or components with various sizes.

An electric apparatus, e.g., a display apparatus, according to the present invention has the resin chassis base screwed to a body, e.g., to a display panel, by use of any one of the plurality of sets of mounting holes of the resin chassis base.

The resin chassis base according to the present invention has the plurality of sets of mounting holes. Therefore, the resin chassis base can be screwed to various components and/or components with various sizes by use of any one of the plurality of sets of mounting holes, whereby general-purpose properties can be enhanced, and the resin chassis base can be shared.

Accordingly, the number of types of the resin chassis base can be reduced. Further, the number of types of a mold required for forming the resin chassis base can be reduced, and parts management in a production factory or the like can easily be attained, whereby cost for the resin chassis base can be reduced.

When the resin chassis base according to the present invention is screwed to a display panel by use of any one of the plurality of sets of mounting holes, the resin chassis base can be downsized, compared to the case where the resin chassis base is mounted to a cavity. Accordingly, component cost can be reduced, and weight of components can be reduced.

DETAILED DESCRIPTION OF THE PREFERRED EMBODIMENTS

One embodiment of the present invention will be described below, in which a display apparatus, more specifically, a liquid crystal display apparatus 30, is employed as an electric apparatus, and a display panel, more specifically, a liquid crystal display panel 32, is employed for a component which is provided in the electric apparatus and to which a resin chassis base 10 is mounted. It is needless to say that the electric apparatus and its component to which the present invention can be applied are not limited thereto. For example, the resin chassis base 10 can be mounted to a body of the electric apparatus.

Figure 1:
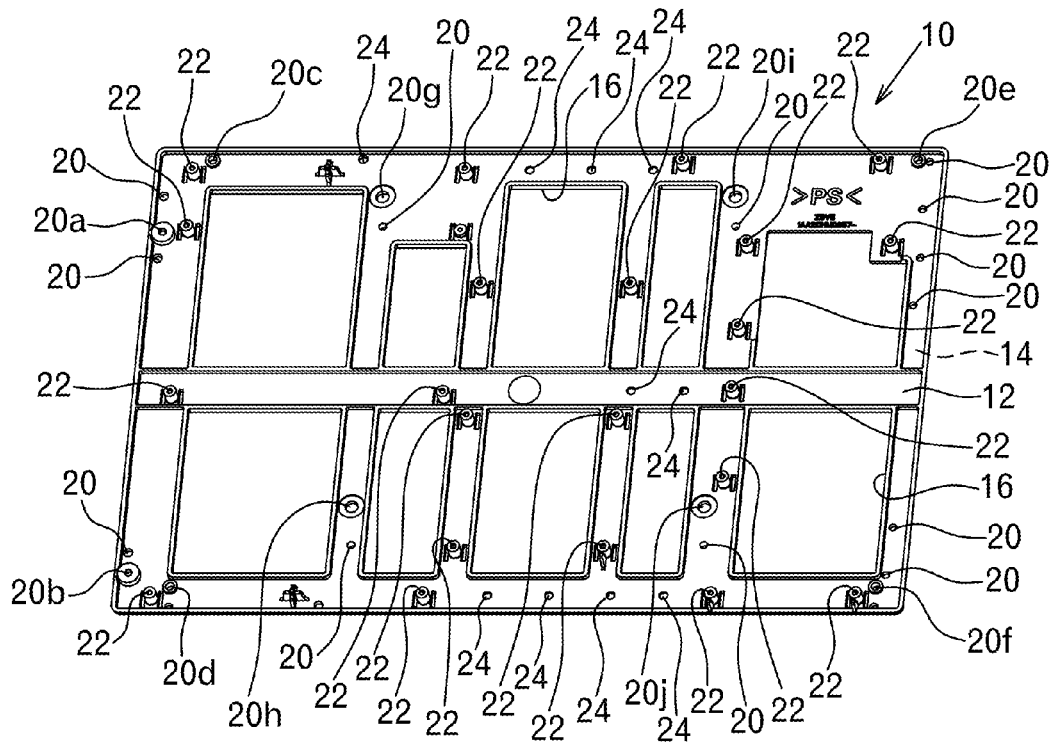
FIG. 1 is a perspective view of a resin chassis base, viewed from a mounting surface side of an electric substrate, according to an embodiment of the present invention.
Figure 2:
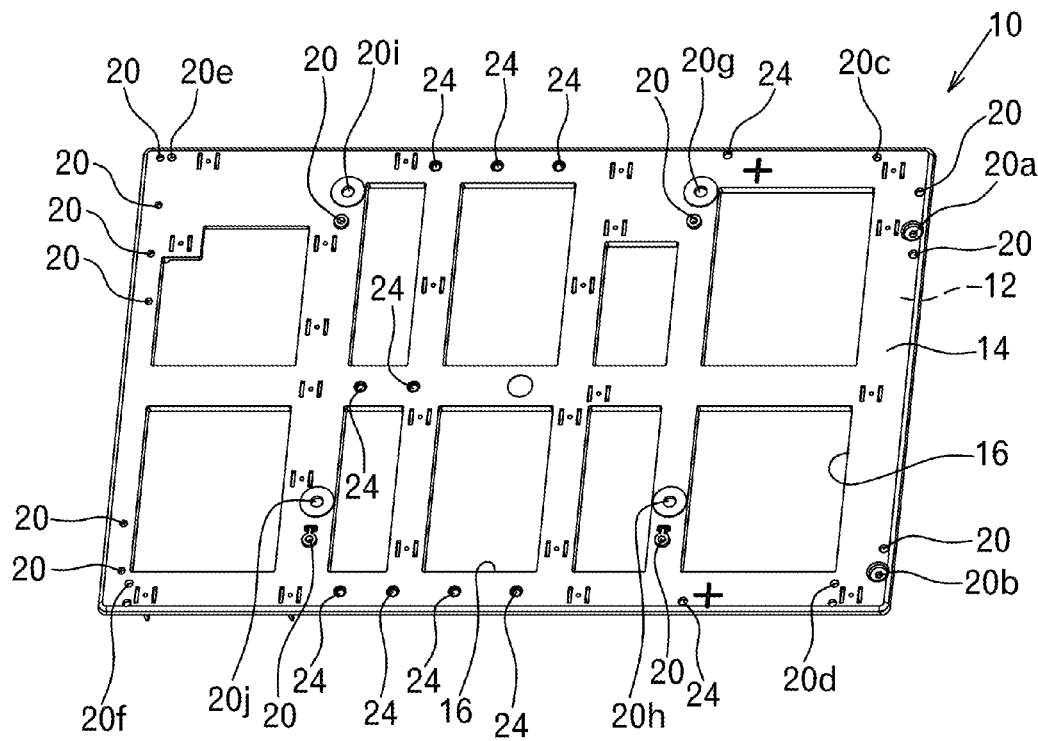
FIG. 2 is a perspective view of the resin chassis base, viewed from a mounting surface side of a display panel, according to the embodiment of the present invention.

FIG. 1 is a perspective view of a resin chassis base 10, viewed from a substrate mounting surface 12 side, according to one embodiment of the present invention, and FIG. 2 is a perspective view of the resin chassis base 10 viewed from a panel mounting surface 14 side.

The resin chassis base 10 can be formed by molding a resin material such as polycarbonate or ABS with a mold. When the resin chassis base 10 is required to have insulating property, a resin material having insulating property is preferably used.

The resin chassis base 10 is a plate-like member having a substantially rectangular outer shape as illustrated in FIGS. 1 and 2, in which a plurality of rods in a longitudinal direction and lateral direction are connected, and a plurality of openings 16 are formed between the rods. The openings 16 are formed in order to reduce weight of the resin chassis base 10 and reduce a resin material to be used.

As illustrated in FIG. 1, the resin chassis base 10 has formed thereon a plurality of mounting holes 20a to 20j used to screw the resin chassis base to a later-described liquid crystal panel 32, a plurality of substrate holes 22 used to screw an electric substrate 40 or the like, and a plurality of wiring holes 24 through which a wiring (not illustrated) is inserted.

As illustrated in FIG. 2, the mounting holes 20a to 20j and the wiring holes 24 are formed to penetrate through the resin chassis base 10, while the substrate holes 22 can be holes with bottom opening to the substrate mounting surface 12 side. The substrate holes 22 may be formed to penetrate through the resin chassis base 10.

The mounting holes 20a to 20j are through-holes formed on the resin chassis base 10 as described above, and they are formed with different intervals as illustrated in FIGS. 1 and 2. When the number of screw holes needed to screw the resin chassis base 10 to the liquid crystal panel 32 is four, at least five mounting holes are desirably formed in order to form a plurality of combinations.

Specifically, the mounting holes include five pairs of mounting holes, such as a pair of 20a, 20b, a pair of 20c, 20d, a pair of 20e, 20f, a pair of 20g, 20h, and a pair of 20i, 20j, as illustrated in FIGS. 1 and 2. The pair of mounting holes 20a, 20b at the right side in FIG. 1 (at the left side in FIG. 2) are formed such that the periphery is convex with respect to the substrate mounting surface 12, while concave with respect to the liquid crystal panel mounting surface 14. The pair of mounting holes 20c, 20d, and the pair of mounting holes 20e, 20f formed on four corners of the resin chassis base 10 are formed such that the periphery is convex with respect to the substrate mounting surface 12, while is flat with respect to the liquid crystal panel mounting surface 14. The pair of mounting holes 20g, 20h and the pair of mounting holes 20i, 20j are formed, close to the center from the pair of mounting holes 20c, 20d and the pair of mounting holes 20e, 20f, such that the periphery is concave with respect to the substrate mounting surface 12, and convex with respect to the liquid crystal panel mounting surface 14.

These mounting holes may be naturally formed to have the same shape.

One set matched to the position of base mounting holes 36 formed on the liquid crystal panel 32 is selected from the mounting holes 20a to 20j, and the selected set can be used for mounting the resin chassis base 10. For example, when the resin chassis base 10 is screwed at four portions, four mounting holes, which are matched to the base mounting holes 36, are selected out of the mounting holes 20a to 20j as one set.

As illustrated in FIG. 1, each of the substrate holes 22 is formed on a cylindrical base projecting from the substrate mounting surface 12. It is desirable that a plurality of substrate holes 22 are formed on the resin chassis base 10 so as to be used for various sizes and types of the electric substrate 40.

As illustrated in FIGS. 1 and 2, a plurality of wiring holes 24 are formed on the resin chassis base 10.

Figure 3:
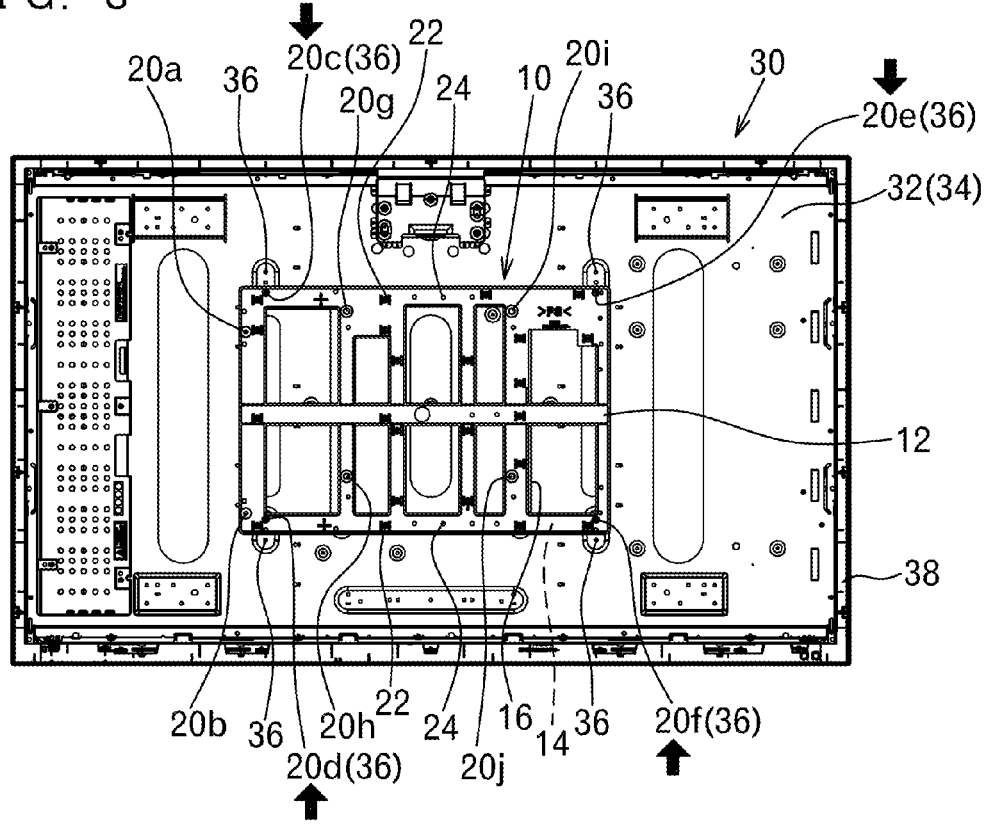
FIG. 3 is a back view illustrating a state where the resin chassis base according to the present invention is screwed to a liquid crystal display panel, i.e., illustrating a state before an electric substrate or the like is mounted.
Figure 5:
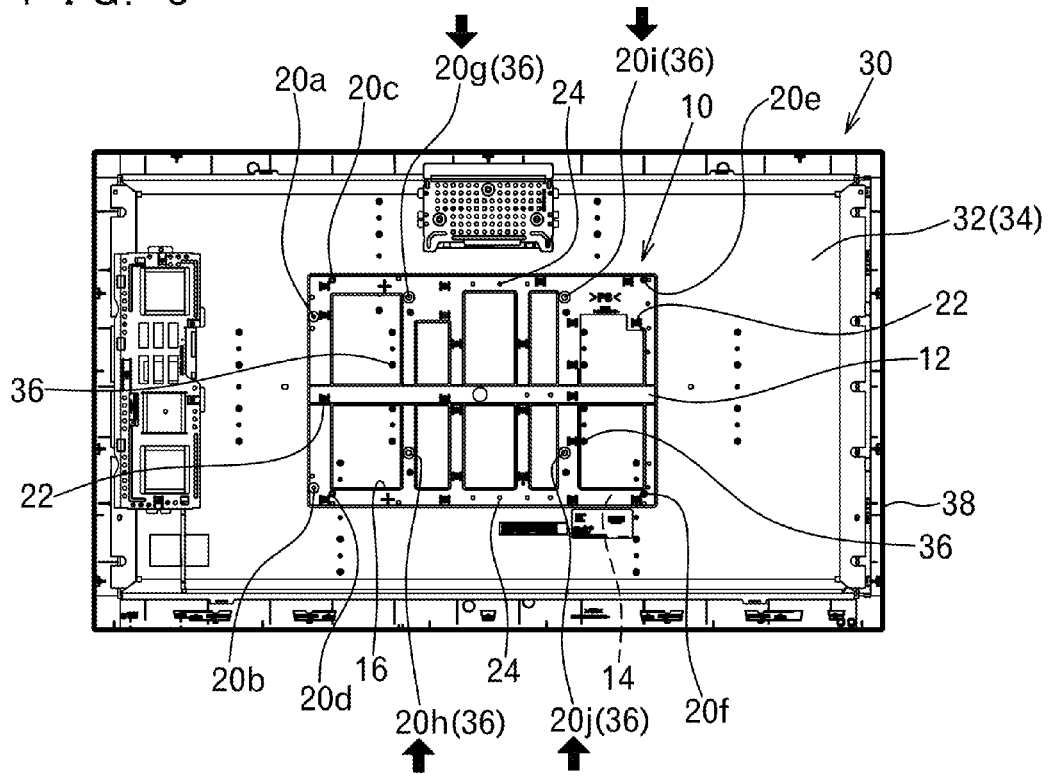
FIG. 5 is a back view illustrating a state where the resin chassis base according to the present invention is screwed to a liquid crystal display panel, having different specification from the liquid crystal display panel in FIG. 3, i.e., illustrating a state before the electric substrate or the like is mounted.
Figure 7:
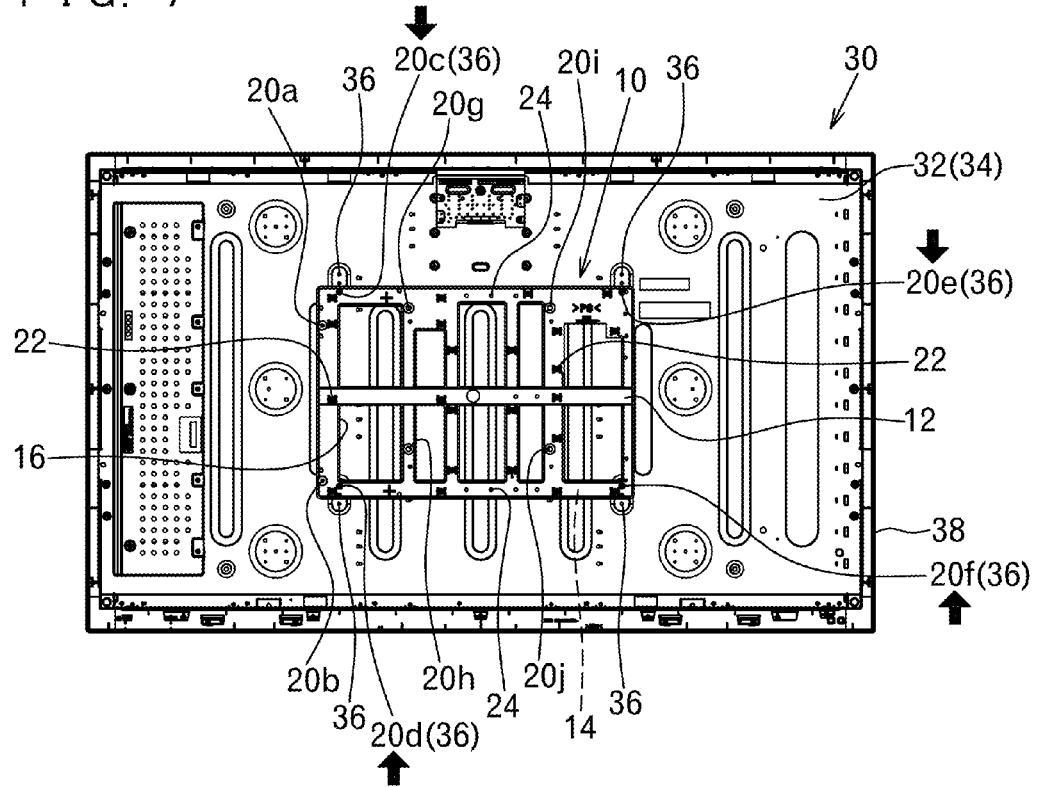
FIG. 7 is a back view illustrating a state where the resin chassis base according to the present invention is screwed to a liquid crystal display panel, having different inch size from the liquid crystal display panels in FIGS. 3 and 5, i.e., illustrating a state before the electric substrate or the like is mounted.

As illustrated in FIGS. 3, 5, and 7, the resin chassis base 10 thus configured can be mounted with screws on a back surface of the liquid crystal panel 32 of the liquid crystal display apparatus 30.

The liquid crystal display apparatus 30 can be configured to enclose the liquid crystal panel 32 with a front cabinet 38 and a rear cabinet (not illustrated). The front cabinet 38 has a window through which the display surface of the liquid crystal panel 32 can visually be confirmed.

A liquid crystal display or an organic EL panel can be used as the liquid crystal penal 32, and a thin plasma panel can be used as a display panel.

FIGS. 3, 5, and 7 illustrate a state where the resin chassis base 10 according to the present invention is screwed to the base mounting surface 34 of the liquid crystal panel 32 at its back side. More specifically, in FIGS. 3 and 5, an inch size of the liquid crystal panel 32 is the same, but the back thereof is different. On the other hand, the liquid crystal panel 32 in FIG. 7 is different in inch size from those in FIGS. 3 and 5.

The resin chassis base 10 is directly mounted to the liquid crystal panel 32 with screws in order that the panel mounting surface 14 faces the base mounting surface 34 that is the back surface. With this structure, the resin chassis base 10 can be downsized, compared to the case where the resin chassis base is mounted so as to cross the front cabinet 38, whereby component cost can be reduced, and weight of the components can be reduced.

Specifically, a plurality of base mounting holes 36 are formed on the base mounting surface 34, and any set of the mounting holes 20a to 20j formed on the resin chassis base 10 is selected to screw (not illustrated) the resin chassis base, whereby the resin chassis base 10 can be mounted to the liquid crystal panel 32.

The resin chassis base 10 is mounted to the liquid crystal panel 32 in FIG. 3 by use of the set including the mounting holes 20c, 20d, 20e, 20f indicated by arrows in FIG. 3.

The resin chassis base 10 is mounted to the liquid crystal panel 32 in FIG. 5 by use of the set, different from the set in FIG. 3, including the mounting holes 20a, 20b, 20e, 20f indicated by arrows in FIG. 5.

The resin chassis base 10 is mounted to the liquid crystal panel 32 in FIG. 7 by use of the set including the mounting holes 20c, 20d, 20e, 20f indicated by arrows in FIG. 7.

Since the plurality of mounting holes 20a to 20j are formed on the resin chassis base 10 as described above, the same resin chassis base 10 can be employed without preparing another resin chassis base according to the positions of the base mounting holes 36, which are different depending upon the liquid crystal panel 32. Accordingly, the type of the resin chassis base 10 can be reduced, and the type of a mold used for forming the resin chassis base can also be reduced. Consequently, the parts management can easily be attained, and component cost can significantly be reduced.

Figure 4:
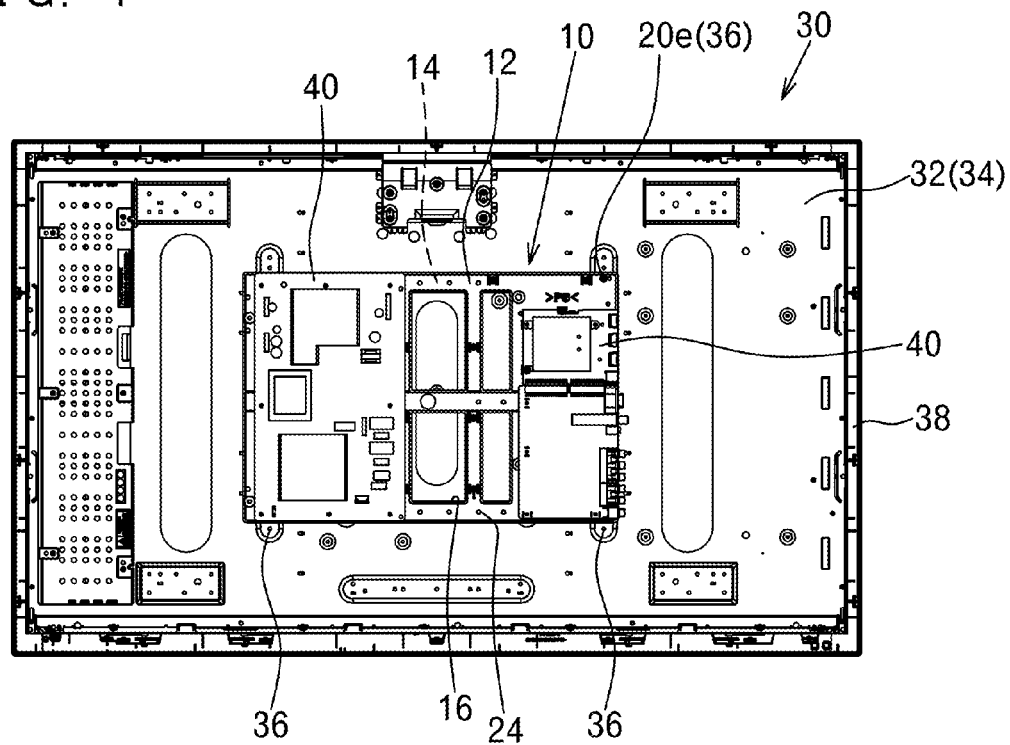
FIG. 4 is a back view illustrating a state where the electric substrate or the like is mounted to the resin chassis base in FIG. 3.
Figure 6:
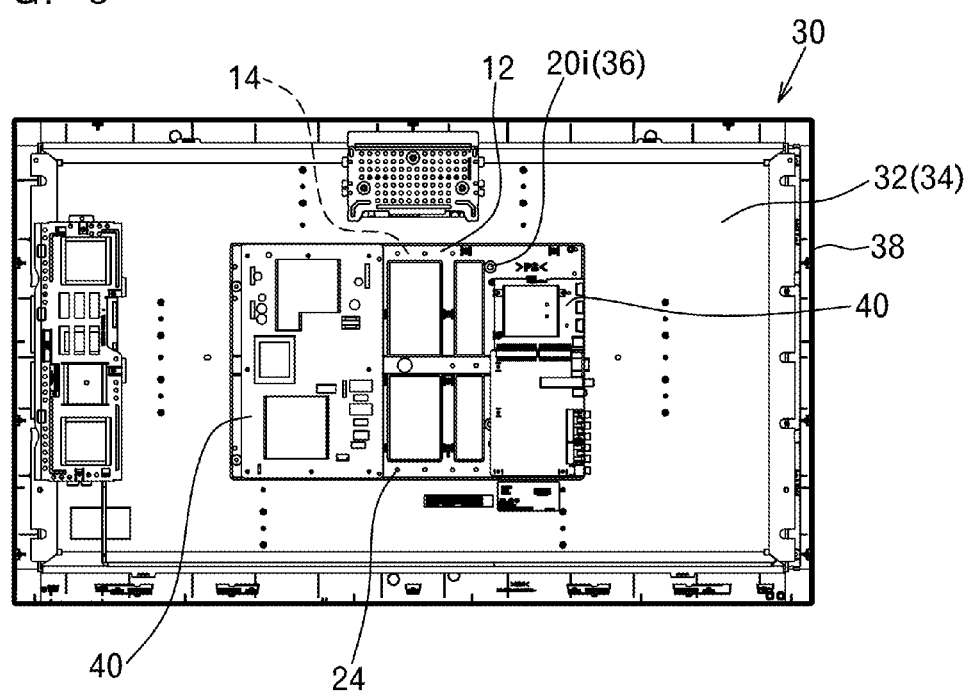
FIG. 6 is a back view illustrating a state where the electric substrate or the like is mounted to the resin chassis base in FIG. 5.
Figure 8:
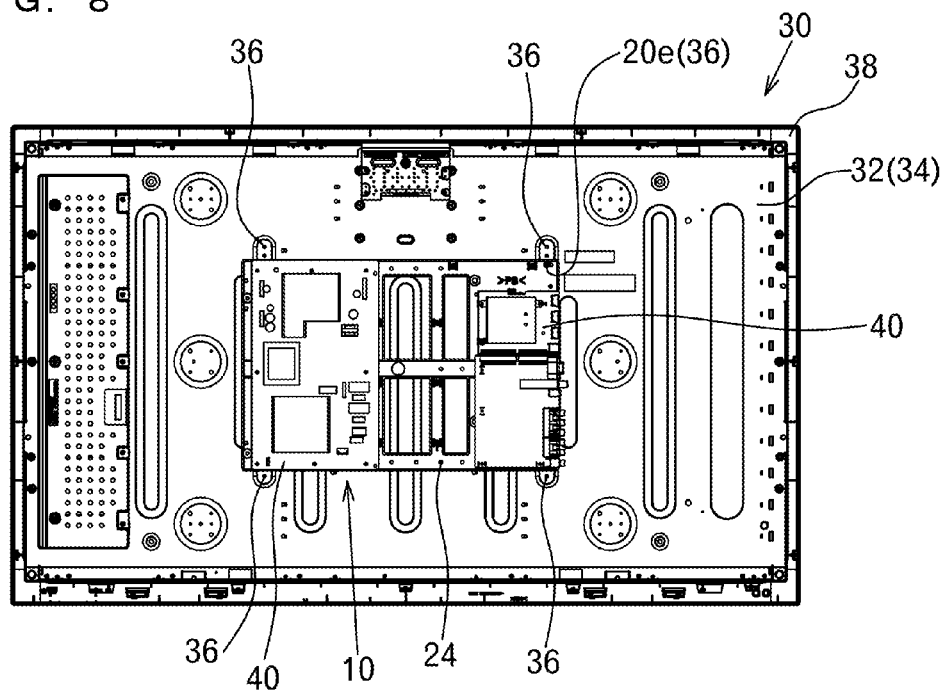
FIG. 8 is a back view illustrating a state where the electric substrate or the like is mounted to the resin chassis base in FIG. 7.

As illustrated in FIGS. 4, 6, and 8, the electric substrate 40 or the like can be mounted to the resin chassis base 10, which is screwed to the liquid crystal panel 32, with screws to the substrate holes 22. According to need, wiring (not illustrated) required for the connection of the electric substrate 40 or the like is inserted through the wiring holes 24.

In the present invention, the resin chassis base 10 is mounted first to the liquid crystal panel 32, and then, the electric substrate 40 is mounted to the resin chassis base 10, in order to prevent the mounting holes 20a to 20j from being hidden under the electric substrate 40.

The resin chassis base 10 according to the present invention has formed thereon many substrate holes 22. Therefore, even if different electric substrate 40 is mounted, some of the substrate holes 22 are selected, whereby the electric substrate 40 can be mounted.

After necessary components, e.g., speakers and the like, are arranged on the front cabinet 38, the rear cabinet is bonded to the front cabinet 38 through engagement or screw, so as to complete the liquid crystal display apparatus 30.

It is needless to say that the shape of the resin chassis base 10, the number of the mounting holes, and the arrangement of the mounting holes are not limited to those in the embodiment.

The present invention is applicable as a resin chassis base that can be used for various components and components with various sizes, and as an electric apparatus provided with the same.

What is claimed is:

1. A resin chassis base fixed on either a first part or a second part disposed in an electronic apparatus, and configured to fix either a first electric substrate or a second electric substrate to be used in the electronic apparatus, said resin chassis base comprising:
a plurality set of mounting holes for the first part and the second part, said plurality set of mounting holes comprising a first set of mounting holes and a second set of mounting holes; and
a plurality set of substrate holes for the first electric substrate and the second electric substrate, said plurality set of substrate holes comprising a first set of substrate holes and a second set of substrate holes;
wherein the first part has a type and/or size which differs from that of the second part,
the first electric substrate has a type and/or size which differs from that of the second electric substrate,
in the case where the resin chassis base is fixed on the first part, the first set of mounting holes is used,
in the case where the resin chassis base is fixed on the second part, the second set of the mounting holes, which differs from the first set of the mounting holes, is used,
in the case where the first electronic substrate is fixed on the resin case base, a first set of substrate holes is used, and
in the case where the second electronic substrate is fixed on the resin case base, a second set of substrate holes, which differs from the first set of the substrate holes, is used.

2. An electric apparatus having the resin chassis base according to claim 1 screwed to the first part or the second part by use of any one of the plurality sets of the mounting holes formed on the resin chassis base.

3. A display apparatus having the resin chassis base according to claim 1 screwed to a first display panel as the first part or a second display panel as the second part by use of any one of the plurality sets of the mounting holes formed on the resin chassis base.

4. The resin chassis base according to claim 1, wherein each periphery of at least a part of the plurality of the mounting holes is formed to be recessed on a substrate mounting surface side.

* * * * *